(12) United States Patent
Yokomae et al.

(10) Patent No.: US 8,779,584 B2
(45) Date of Patent: Jul. 15, 2014

(54) SEMICONDUCTOR APPARATUS

(75) Inventors: Toshiyuki Yokomae, Matsumoto (JP); Katsumichi Ueyanagi, Matsumoto (JP); Eiji Mochizuki, Nagano (JP); Yoshinari Ikeda, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 1553 days.

(21) Appl. No.: 11/896,153

(22) Filed: Aug. 30, 2007

(65) Prior Publication Data
US 2008/0087994 A1 Apr. 17, 2008

(30) Foreign Application Priority Data
Oct. 16, 2006 (JP) ................. 2006-281695

(51) Int. Cl.
*H01L 23/34* (2006.01)
(52) U.S. Cl.
USPC .................................. 257/724; 257/E23.113
(58) Field of Classification Search
USPC .......... 257/724, 706, 707, E23.101, E23.113, 257/E23.075
See application file for complete search history.

(56) References Cited

U.S. PATENT DOCUMENTS

| 2001/0012671 A1* | 8/2001 | Hoshino et al. ............... 438/305 |
| 2002/0179289 A1* | 12/2002 | Yamashita et al. ........ 165/104.33 |
| 2006/0060963 A1* | 3/2006 | Chang .......................... 257/706 |
| 2007/0152321 A1* | 7/2007 | Shi et al. ...................... 257/704 |
| 2008/0246130 A1* | 10/2008 | Carney et al. ................ 257/675 |

FOREIGN PATENT DOCUMENTS

| JP | S63-063588 A | 3/1988 |
| JP | H03-174747 A | 7/1991 |
| JP | 2000-068447 | 3/2000 |
| JP | 2002-043779 A | 2/2002 |
| JP | 2004-096135 | 3/2004 |
| JP | 2004-228461 A | 8/2004 |
| JP | 2005-064441 | 3/2005 |
| JP | 2005-116702 | 4/2005 |
| WO | WO2006068643 | * 6/2006 |

OTHER PUBLICATIONS

Japan Patent Office, "Office Action for JP 2012-091639", Apr. 9, 2013.

* cited by examiner

*Primary Examiner* — Vongsavanh Sengdara
(74) *Attorney, Agent, or Firm* — Manabu Kanesaka

(57) ABSTRACT

A semiconductor apparatus equipped with at least one semiconductor element includes a metallic plate bonded to an upper surface of the semiconductor element and a conductor plate, bonded to the metallic plate and serving as an electric current path of the semiconductor apparatus. The conductor plate and the metallic plate are bonded to each other by laser welding at a part other than a part directly above the semiconductor element. As a result, heat damage caused by laser welding can be reduced.

14 Claims, 6 Drawing Sheets

SEMICONDUCTOR APPARATUS

BACKGROUND OF THE INVENTION AND RELATED ART STATEMENT

The present invention relates to a semiconductor apparatus, and more particularly to a semiconductor apparatus employing bonding technology.

In recent years, a semiconductor apparatus equipped with a semiconductor element such as an IGBT (insulated gate bipolar transistor) has been used as a power converter such as an industrial inverter (see e.g. Japanese Laid-Open Patent Publication (Kokai) No. 2005-116702).

FIG. 8 is a sectional view schematically showing the essential parts of a conventional semiconductor apparatus.

FIG. 8 is useful in explaining the basic construction of the semiconductor apparatus equipped with an IGBT element.

In this semiconductor apparatus, an insulated substrate 202 is bonded to a Cu (copper) base 200, which is a cooling element, via a solder 201. A resin case 205 is fixed to an upper end edge 203 of the Cu base 200 in such a manner as to enclose the IGBT element 204.

An emitter terminal 206 and a collector terminal 207, which are external lead-out terminals, are provided on an inner wall of the resin case 205 and electrically connected to a circuit pattern 210, which is formed on the insulated substrate 202, via aluminum wires 208 and 209, respectively.

A heat spreader 212 is bonded to an emitter electrode, not shown, which is located on an upper surface of the IGBT element 204, via a solder 211. The heat spreader 212 is a metallic plate that spreads heat generated during operation of the IGBT element 204 and is electrically connected to the emitter electrode formed on the surface of the IGBT element 204. One end of an aluminum wire 203 is bonded to an upper surface of the heat spreader 212, and the other end of the aluminum wire 203 is connected to the circuit pattern 210 formed on the insulated substrate 202. That is, the emitter electrode on the IGBT element 204 and the emitter terminal 206 are electrically connected to each other via the aluminum wires 208 and 213.

Also, a collector electrode, not shown, is formed on a lower surface of the IGBT element 204 and connected to the circuit pattern 210 on the insulated substrate 202 via a solder 214. Also, a gate electrode, not shown, is formed on the surface of the IGBT element 204, and an aluminum wire 215a for electrically connecting the gate electrode and the circuit pattern 210 with each other is bonded to the IGBT element 204. An aluminum wire 215b extends from the part of the circuit pattern 210 which is electrically connected to the gate electrode, and an end of the aluminum wire 215b is connected to a gate terminal, not shown, provided inside the resin case 205.

As described above, in a semiconductor apparatus equipped with an IGBT element or the like, components are bonded to one another using metallic wires so as to ensure electrical connection between the components.

Also, recently, there has been proposed a method in which a metallic conductor plate is used in place of the aluminum wires 208, 209, and 213 illustrated in FIG. 8 (see e.g. Japanese Laid-Open Patent Publication (Kokai) No. 2004-965135).

It has been reported that according to this method, heat dissipation can be improved as compared with a case where aluminum wires are used since a flat-shaped conductor plate is bonded onto an electrode of a semiconductor element.

In this reported example, bonding of the conductor plate is carried out using an ultrasonic bonding method.

However, in e.g. the semiconductor apparatus illustrated in FIG. 8, if bonding of a conductor plate in place of the aluminum wires 208, 209, and 213 is carried out by ultrasonic bonding, a crack may appear in the solder 211 at the bonding interface between the IGBT element 204 and the heat spreader 212 due to vibrations and loads during welding. As a consequence, adequate continuity between the emitter electrode and the heat spreader 212 may not be ensured. Therefore, it is preferred that bonding using a conductor plate in place of wires is carried out by laser welding.

However, if a conductor plate is bonded onto the heat spreader 212 by laser welding, the bonding interface between the conductor plate and the heat spreader 212 is locally heated by laser irradiation. The locally generated heat is transmitted to a semiconductor element such as the IGBT element 214 through the heat spreader 212, which causes heat damages to the semiconductor element.

The present invention has been developed in view of the above described circumstances and provides a semiconductor apparatus which can reduce heat damage even if laser welding is carried out.

Further objects and advantages of the invention will be apparent from the following description of the invention.

SUMMARY OF THE INVENTION

To attain the above object, the present invention provides a semiconductor apparatus equipped with at least one semiconductor element, comprising a metallic plate bonded to an upper surface of the semiconductor element, and a conductor plate bonded to the metallic plate and serving as an electric current path of the semiconductor apparatus, wherein the conductor plate and the metallic plate are bonded to each other by laser welding at a part other than a part directly above the semiconductor element.

This semiconductor apparatus, which is equipped with at least one semiconductor element, is comprised of the metallic plate bonded to the upper surface of the semiconductor element, and the conductor plate bonded to the metallic plate and serving as an electric current path of the semiconductor apparatus. The conductor plate and the metallic plate are bonded to each other by laser welding at a part other than a part directly above the semiconductor element.

Further, the present invention provides a semiconductor apparatus equipped with a plurality of semiconductor elements, comprising a metallic plate welded to upper surfaces of the plurality of semiconductor elements, and a conductor plate bonded to the metallic plate and serving as an electric current path of the semiconductor apparatus, wherein the conductor plate and the metallic plate are bonded to each other by laser welding at a part directly above a midsection between the adjacent semiconductor elements.

This semiconductor apparatus, which is equipped with a plurality of semiconductor elements, is comprised of the metallic plate welded to upper surfaces of the plurality of semiconductor elements, and the conductor plate bonded to the metallic plate and serving as an electric current path of the semiconductor apparatus. The conductor plate and the metallic plate are bonded to each other by laser welding at a part directly above a midsection between the adjacent semiconductor elements.

As a result, the semiconductor apparatus which can reduce heat damage even if the metallic plate bonded onto the upper surface of a semiconductor element and the conductor plate serving as an electric current path of the semiconductor apparatus are bonded to each other by laser welding.

BRIEF DESCRIPTION OF THE DRAWINGS

FIGS. 1A and 1B are views schematically showing the essential parts of a semiconductor apparatus according to a first embodiment of the present invention, in which FIG. 1A is a three-dimensional view schematically showing the essential parts of the semiconductor apparatus, and FIG. 1B is a sectional view schematically showing the essential parts of the semiconductor apparatus.

FIGS. 6A to 6D are views explaining a variation of a raised portion, in which FIG. 6A shows an inclined structure, FIG. 6B shows a curved structure, and FIGS. 6C and 6D show bent structures.

FIGS. 7A and 7B are views schematically showing the essential parts of a semiconductor apparatus according to a sixth embodiment of the present invention, in which FIG. 7A is a three-dimensional view schematically showing the essential parts of the semiconductor apparatus, FIG. 7B is an upper view schematically showing the essential parts of the semiconductor apparatus.

DETAILED DESCRIPTION OF PREFERRED EMBODIMENTS

The present invention will be described in detail below with reference to the drawings showing preferred embodiments thereof. In the embodiments described below, it is assumed that a semiconductor apparatus is equipped with a plurality of semiconductor elements.

First, a first embodiment of the present invention will be made.

Figure 1A:
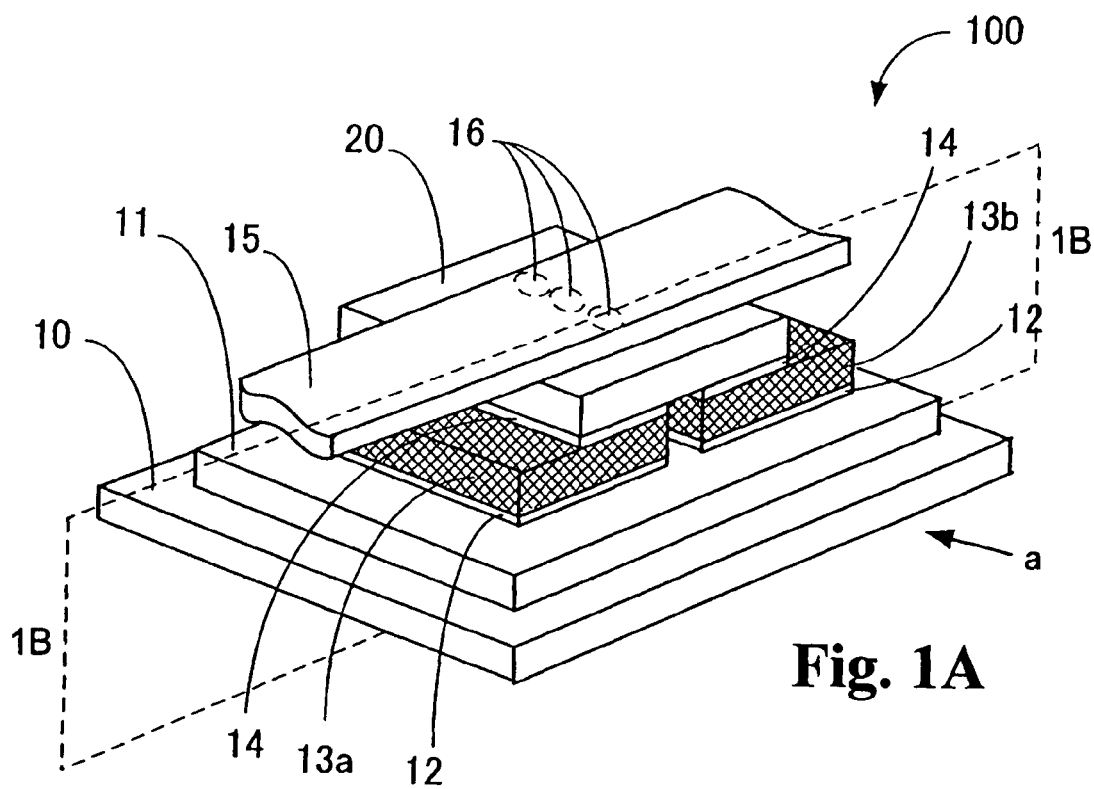
Figure 1B:
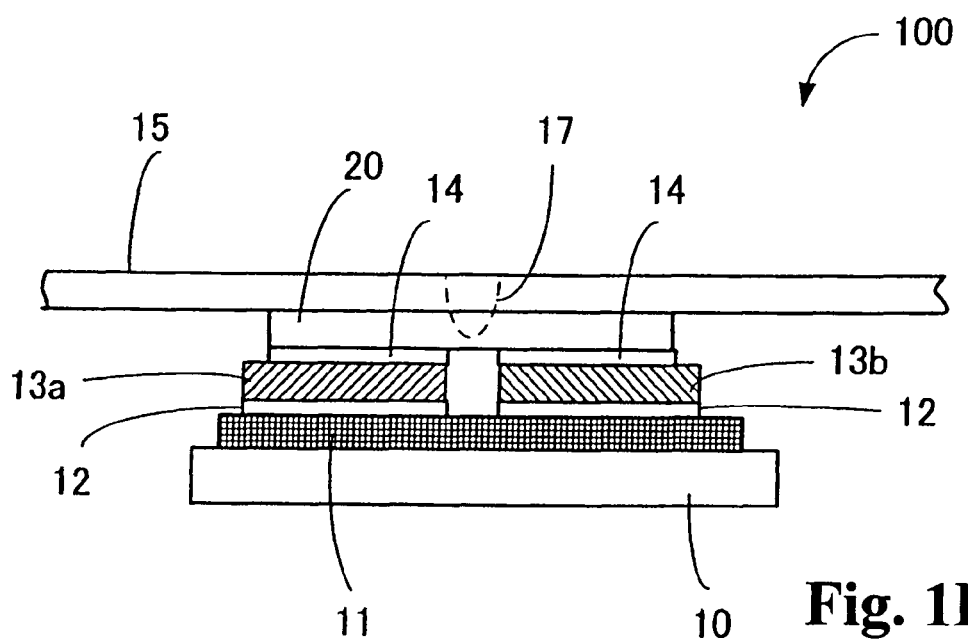

FIGS. 1A and 1B are views schematically showing a semiconductor apparatus according to the first embodiment, in which FIG. 1A is a three-dimensional view schematically showing the essential parts of the semiconductor apparatus, and FIG. 1B is a schematic sectional view of a cross-section 1B-1B of the semiconductor apparatus as viewed from a direction indicated by an arrow a in FIG. 1A. It should be noted that in FIGS. 1A and 1B, a cooling element, external lead-out terminals, and a resin case in the semiconductor apparatus are not illustrated.

The semiconductor apparatus 100 is comprised of a Cu foil 11 bonded to an insulated substrate 10 by DCB (direct copper bonding). Two semiconductor elements 13a and 13b, for example, are soldered onto the Cu foil 11 via a solder 12. Incidentally, it is known that semiconductor elements generate heat while they are operating. Accordingly, in the semiconductor apparatus 100, a predetermined distance is placed between the two semiconductor elements 13a and 13b so that heat generated by them can efficiently spread over the Cu foil 11. Further, a metallic plate 20 as a heat spreader is laid across and soldered onto the semiconductor elements 13a and 13b via a solder 14 so that heat can spread from the upper surfaces of the semiconductor elements 13a and 13b.

On the metallic plate 20, there is disposed a conductor plate 15 (lead frame) electrically connected to external lead-out terminals, not shown, of the semiconductor apparatus 100. The conductor plate 15 is welded onto the metallic plate 20 by laser welding.

Laser welding is carried out by, for example, irradiating laser light, not shown, on a plurality of laser irradiated portions 16. That is, the conductor plate 15 and the metallic plate 20 are bonded to each other by partially melting the conductor plate 15 and the metallic plate 20 onto which the laser light is irradiated.

A molten portion 17 (area indicated by a dotted line) where parts of the conductor plate 15 and the metallic plate 20 are molten is not provided directly above the semiconductor elements 13a and 13b, but is provided directly above the midsection between the adjacent semiconductor elements 13a and 13b.

It should be noted that a laser used in laser welding is a YAG laser (1064 nm), and the power of laser light irradiated on the laser irradiated portions 16 is 2 to 10 kW. The irradiation time is 5 to 50 msec, and the irradiation energy is 10 to 100 J.

Also, the conductor plate 15 has a thickness of 0.3 to 1.5 mm and a width of 1 to 50 mm. The metallic plate 20 has a thickness of 0.3 to 1.5 mm. The conductor plate 15 and the metallic plate are made of, for example, a Cu or CuMo (copper molybdenum) alloy. Also, a Ni (nickel) coating may be applied to surfaces of the conductor plate 15 and the metallic plate 20 so as to improve laser light absorption efficiency.

Also, the semiconductor elements 13a and 13b may be of either the same type or different types. For example, both the semiconductor devices 13a and 13b may be either IGBT elements or FWD (free wheeling diode) elements. One of the semiconductor devices 13a and 13b may be an IGBT element, and the other one may be a FWD element.

As described above, in the semiconductor apparatus 100, areas directly above the semiconductor elements 13a and 13b are avoided in bonding the conductor plate 15 and the metallic plate 20 to each other. Specifically, the metallic plate 20 and the conductor plate 15 are bonded to each other by laser welding in an area directly above the midsection between the adjacent semiconductor elements 13a and 13b.

In the semiconductor apparatus 100 constructed as described above, the molten portion 17 is formed away from the areas directly above the semiconductor elements 13a and 13b. A predetermined distance is placed between the molten portion 17 and the upper surfaces of the semiconductor elements 13a and 13b. Thus, during laser welding, heat generated locally in the conductor plate 15 and the metallic plate 20 can be spread to a sufficient degree by the conductor plate 15 and the metallic plate 20 before reaching the semiconductor elements 13a and 13b.

As a result, in the semiconductor apparatus, heat damage to the semiconductor elements 13a and 13b caused by laser irradiation even if the conductor plate 15 and the metallic plate 20 are bonded to each other by laser welding is reduced.

Next, a second embodiment of the present invention will be explained.

Figure 2:
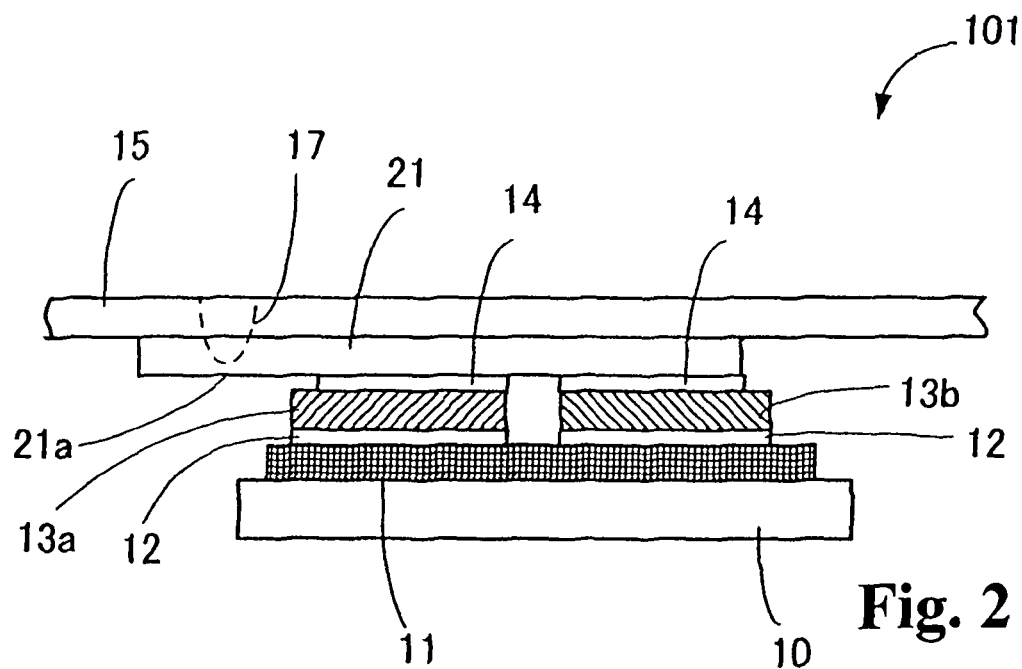
FIG. 2 is a sectional view schematically showing the essential parts of a semiconductor apparatus according to a second embodiment of the present invention.

FIG. 2 is a sectional view schematically showing the essential parts of a semiconductor apparatus according to the second embodiment. In the following description of the second embodiment, the elements as those appearing in FIG. 1 are denoted by the same reference numerals, and detailed description thereof is omitted. It should be noted that in FIG. 2, a cooling element, external lead-out terminals, and a resin case in the semiconductor apparatus are not illustrated.

In this semiconductor apparatus 101, a metallic plate 21 is laid across and soldered onto semiconductor elements 13*a* and 13*b* via a solder 14 and bonded to the semiconductor plates 13*a* and 13*b* by soldering.

Here, the metallic plate 21 is disposed directly above the semiconductor elements 13*a* and 13*b* and laterally extends from the semiconductor element 13*a* to form a roof-like portion 21*a*.

A conductor plate 15 is welded onto the metallic plate 21 by laser welding.

Laser welding is carried out by, for example, irradiating laser light, not shown, from above the conductor plate 15. That is, the conductor plate 15 and the metallic plate 21 are bonded to each other by partially melting each of the conductor plate 15 and the metallic plate 21 onto which the laser light is irradiated.

A molten portion 17 where parts of the conductor plate 15 and the metallic plate 21 are molten is not provided directly above the semiconductor elements 13*a* and 13*b*, but is provided in the roof-like portion 21*a* of the metallic plate 21 and the part of the conductor plate 15 located on the roof-like portion 21*a*.

As described above, in the semiconductor apparatus 101, the conductor plate 15 is bonded to the part of the metallic plate 21 other than parts thereof directly above the semiconductor elements 13*a* and 13*b* by laser welding. Specifically, the roof-like portion 21*a* of the metallic plate 21 and the conductor plate 15 are bonded to each other by laser welding.

In the semiconductor apparatus 101 constructed as described above, the molten portion 17 is formed away from areas directly above the semiconductor elements 13*a* and 13*b*. A predetermined distance is placed between the molten portion 17 and the upper surfaces of the semiconductor elements 13*a* and 13*b*. Thus, during laser welding, heat generated locally in the conductor plate 15 and the metallic plate 21 can be spread to a sufficient degree by the conductor plate 15 and the metallic plate 21 before reaching the semiconductor elements 13*a* and 13*b*.

As a result, the semiconductor apparatus which can reduce heat damage to the semiconductor elements 13*a* and 13*b* caused by laser irradiation even if the conductor plate 15 and the metallic plate 21 are bonded to each other by laser welding can be realized.

Next, a third embodiment of the present invention will be explained.

Figure 3:
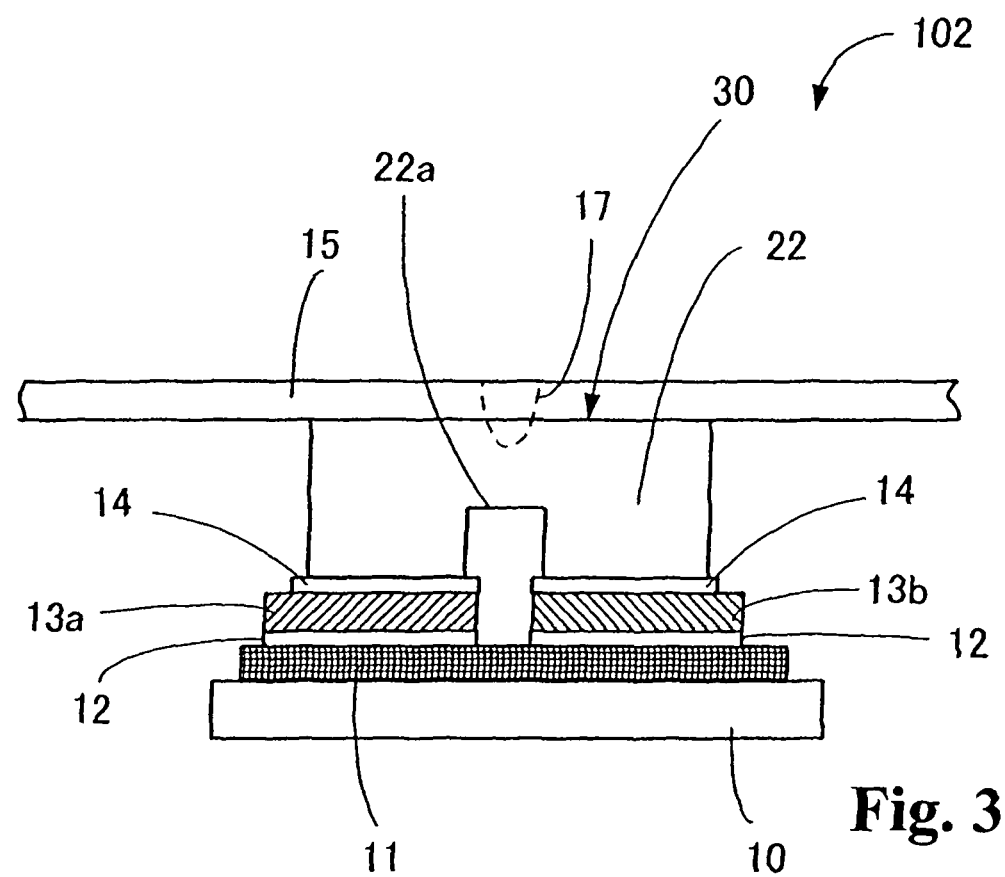
FIG. 3 is a sectional view schematically showing the essential parts of a semiconductor apparatus according to a third embodiment of the present invention.

FIG. 3 is a sectional view schematically showing the essential parts of a semiconductor apparatus according to the third embodiment. In the following description of the third embodiment, the elements as those appearing in FIG. 1 are denoted by the same reference numerals, and detailed description thereof is omitted. It should be noted that in FIG. 3, a cooling element, external lead-out terminals, and a resin case in the semiconductor apparatus are not illustrated.

In this semiconductor apparatus 102, a metallic plate 22 is laid across and soldered onto semiconductor elements 13*a* and 13*b* via a solder 14 and bonded to the semiconductor plates 13*a* and 13*b* by soldering.

Here, the metallic plate 22 is a block and has a lower surface thereof with a groove portion 22*a* formed therein. As a whole, the metallic plate 22 has an inverted groove structure. Further, the metallic plate 22 has a predetermined volume.

A conductor plate 15 is welded onto the metallic plate 22 by laser welding.

Here, laser welding is carried out by, for example, irradiating laser light, not shown, from above the conductor plate 15. That is, the conductor plate 15 and the metallic plate 22 are bonded to each other by partially melting each of the conductor plate 15 and the metallic plate 21 onto which the laser light is irradiated.

Specifically, a molten portion 17 where parts of the conductor plate 15 and the metallic plate 22 are molten is provided directly above the midsection between the semiconductor elements 13*a* and 13*b*, and a predetermined distance is placed between the bonding interface between the conductor plate 15 and the metallic plate 22 and the upper surfaces of the semiconductor elements 13*a* and 13*b*.

As described above, in the semiconductor apparatus 102, the conductor plate 15 is bonded to the part of the metallic plate 22 other than parts thereof directly above the semiconductor elements 13*a* and 13*b* by laser welding. Specifically, the metallic plate 22 is a block, and the groove portion 22*a* is provided in the lower part of the metallic plate 22 which corresponds to the midsection between the adjacent semiconductor elements 13*a* and 13*b*.

In the semiconductor apparatus 102 constructed as described above, a predetermined distance is placed between the molten portion 17 and the upper surfaces of the semiconductor elements 13*a* and 13*b*. Further, the metallic plate 22 has a predetermined volume so as to absorb and spread heat generated during operation of the semiconductor elements 13*a* and 13*b*. Thus, during laser welding, heat generated locally in the conductor plate 15 and the metallic plate 22 can be spread to a sufficient degree by the conductor plate 15 and the metallic plate 22 before reaching the semiconductor elements 13*a* and 13*b*.

It should be noted that the molten portion 17 may be provided directly above the semiconductor elements 13*a* and 13*b* insofar as the conductor plate 15 has such a thickness as not to be affected by heat generation during laser welding.

As a result, in the semiconductor apparatus, heat damage to the semiconductor elements 13*a* and 13*b* caused by laser irradiation even if the conductor plate 15 and the metallic plate 22 are bonded to each other by laser welding can be reduced Further, the metallic plate 22 is easy to machine, and hence costs can be reduced.

Next, a fourth embodiment of the present invention will be explained.

Figure 4:
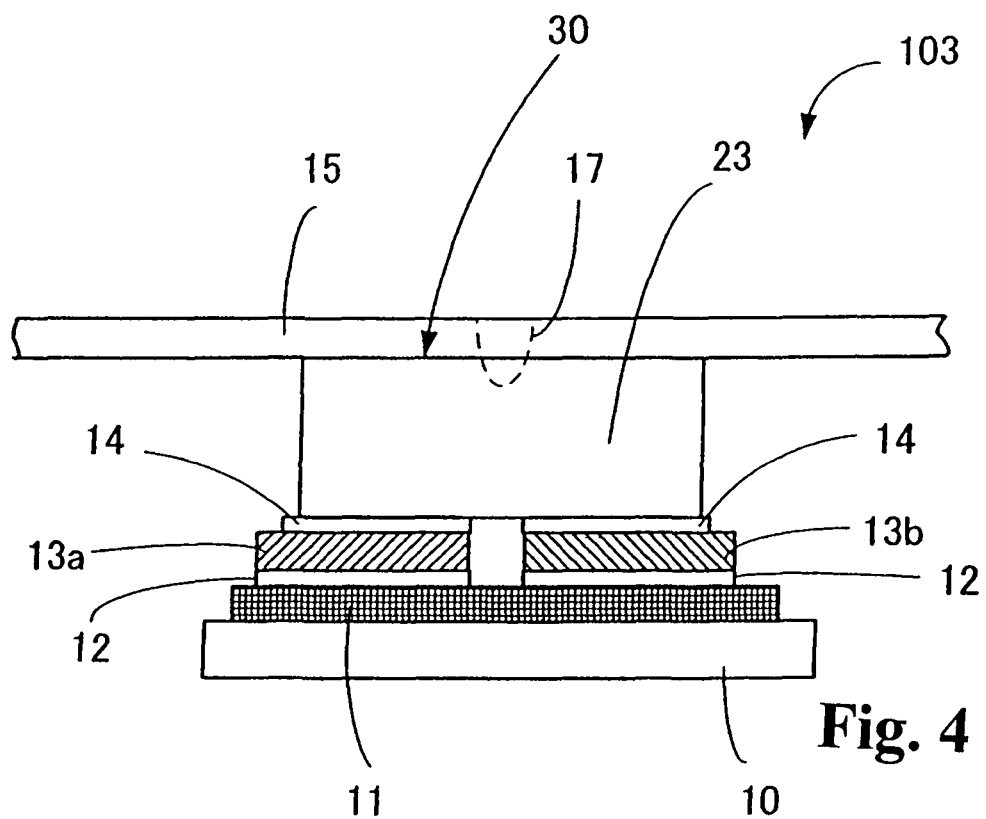
FIG. 4 is a sectional view schematically showing the essential parts of a semiconductor apparatus according to a fourth embodiment of the present invention.

FIG. 4 is a sectional view schematically showing the essential parts of a semiconductor apparatus according to the fourth embodiment. In the following description of the fourth embodiment, the elements as those appearing in FIG. 1 are denoted by the same reference numerals, and detailed description thereof is omitted. It should be noted that in FIG. 4, a cooling element, external lead-out terminals, and a resin case in the semiconductor apparatus are not illustrated.

In this semiconductor apparatus 103, a metallic plate 23 is laid across and soldered onto semiconductor elements 13*a* and 13*b* via a solder 14 and bonded to the semiconductor plates 13*a* and 13*b* by soldering.

Here, the metallic plate 23 is a rectangular parallelepiped and has a predetermined volume.

A conductor plate 15 is welded onto the metallic plate 23 by laser welding.

Here, laser welding is carried out by, for example, irradiating laser light, not shown, from above the conductor plate 15. That is, the conductor plate 15 and the metallic plate 23 are bonded to each other by partially melting each of the conductor plate 15 and the metallic plate 23 onto which the laser light is irradiated.

Specifically, a molten portion 17 where parts of the conductor plate 15 and the metallic plate 23 are molten is provided between the semiconductor elements 13a and 13b, and a predetermined distance is placed between a bonding interface 30 between the conductor plate 15 and the metallic plate 23 and the upper surfaces of the semiconductor elements 13a and 13b. Further, the metallic plate 23 is a rectangular parallelepiped and has a predetermined volume so as to absorb and spread heat generated during operation of the semiconductor elements 13a and 13b.

In the semiconductor apparatus 103 constructed as described above, a predetermined distance is placed between the molten portion 17 and the upper surfaces of the semiconductor elements 13a and 13b. Further, the metallic plate 23 has a predetermined volume so as to absorb and spread heat generated during operation of the semiconductor elements 13a and 13b. Thus, during laser welding, heat generated locally in the conductor plate 15 and the metallic plate 23 can be spread to a sufficient degree by the conductor plate 15 and the metallic plate 23 before reaching the semiconductor elements 13a and 13b.

It should be noted that the molten portion 17 may be provided directly above the semiconductor elements 13a and 13b insofar as the conductor plate 15 has such a thickness not to be affected by heat generation during laser welding.

As a result, in the semiconductor apparatus, heat damage to the semiconductor elements 13a and 13b caused by laser irradiation even if the conductor plate 15 and the metallic plate 23 are bonded to each other by laser welding can be reduced.

Further, the metallic plate 23 is easy to machine, and hence costs can be reduced. It should be noted that the thickness of the metallic plate 23 has only to be greater than the depth of the molten portion 17.

Next, a fifth embodiment of the present invention will be explained.

Figure 5:
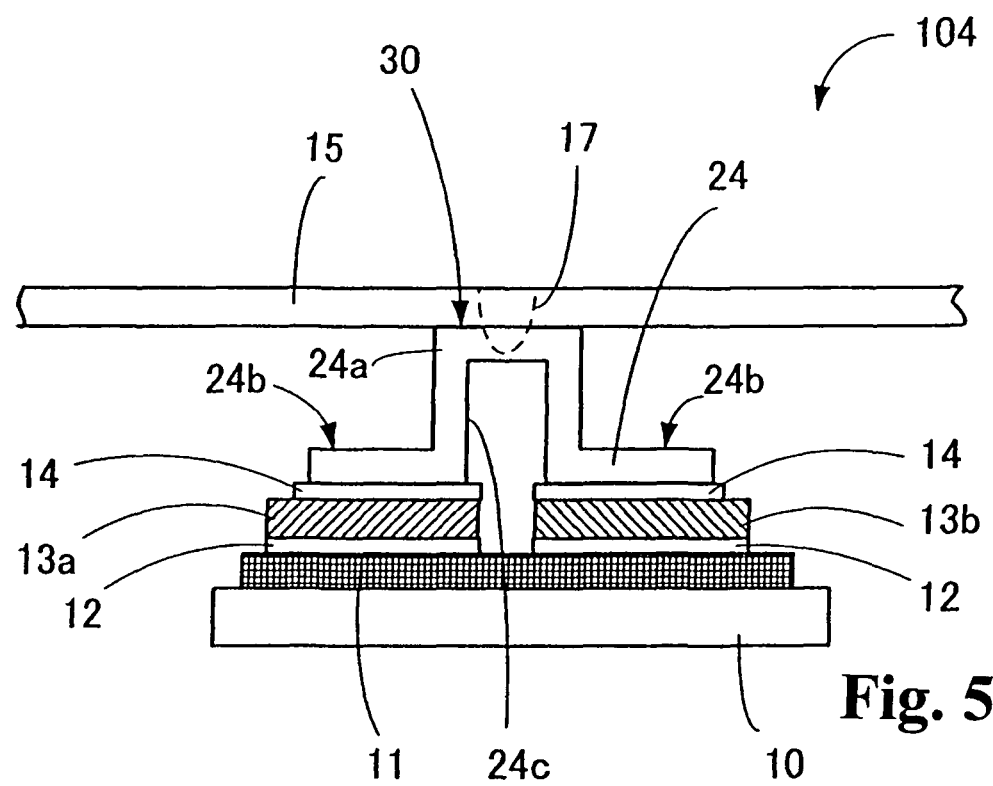
FIG. 5 is a sectional view schematically showing the essential parts of a semiconductor apparatus according to a fifth embodiment of the present invention.

FIG. 5 is a sectional view schematically showing the essential parts of a semiconductor apparatus according to the fifth embodiment. In the following description of the fifth embodiment, the elements as those appearing in FIG. 1 are denoted by the same reference numerals, and detailed description thereof is omitted. It should be noted that in FIG. 5, a cooling element, external lead-out terminals, and a resin case in the semiconductor apparatus are not illustrated.

In this semiconductor apparatus 104, a metallic plate 24 is laid across and soldered onto semiconductor elements 13a and 13b via a solder 14 and bonded to the semiconductor plates 13a and 13b by soldering.

Here, the metallic plate 24 is not a flat plate but has a projecting portion 24a at a part corresponding to the midsection between the adjacent semiconductor elements 13a and 13b (in FIG. 5, the central area of the metallic plate 24). Steps are provided between the central area in which the projecting portion 24a is formed, and upper end faces 24b. A flat surface for laser welding to a conductor plate 15 is formed in an upper surface of the projecting portion 24a. In the illustrated example, side wall portions 24c are raised in a substantially vertical direction from the upper end faces 24b, and the projecting portion 24a is a substantially rectangle. The projecting portion 24, however, should not necessarily be a rectangle. For example, the side wall portions 24c may be inclined, bent in the middle, or curved as will be described below.

Figure 6A:
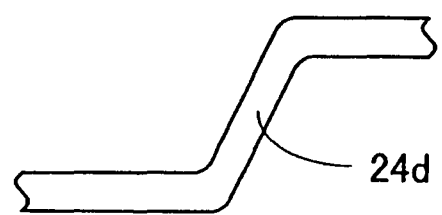
Figure 6B:
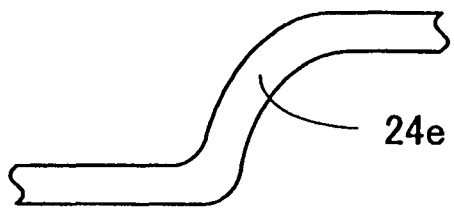
Figure 6C:
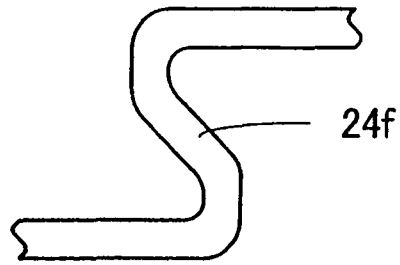
Figure 6D:
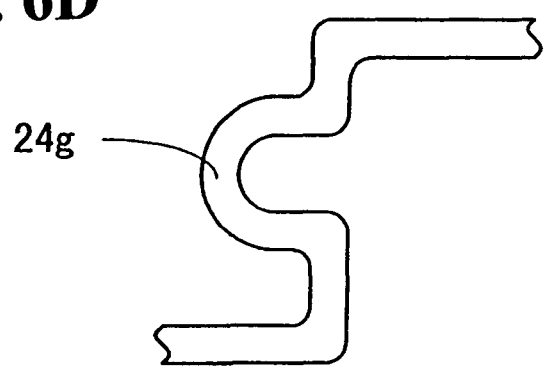

FIGS. 6A to 6D are views explaining variations of the raised portion, in which FIG. 6A shows an inclined structure, FIG. 6B shows a curved structure, and FIGS. 6C and 6D show bent structures.

As shown in FIGS. 6A to 6D, the side wall portion 24c may be implemented by a side wall portion 24d having an inclined structure in FIG. 6A, a side wall portion 24e having a curbed structure in FIG. 6B, or a side wall portion 24f or 24g having a bent structure in FIG. 6C or 6D.

Since the side wall portion 24c has such a shape, stress produced by bonding with the conductor plate 15 can be reduced.

The conductor plate 15 is welded onto the metallic plate 24 by laser welding.

Laser welding is carried out by, for example, irradiating laser light, not shown, from above the conductor plate 15. That is, the conductor plate 15 and the metallic plate 23 are bonded to each other by partially melting each of the conductor plate 15 and the projecting portion 24a onto which the laser light is irradiated.

Specifically, a molten portion 17 where parts of the conductor plate 15 and the projecting portion 24a are molten is provided directly above the midsection between the semiconductor elements 13a and 13b, and a predetermined distance is placed between a bonding interface 30 between the conductor plate 15 and the projecting portion 24a and the upper surfaces of the semiconductor elements 13a and 13b.

As described above, in the semiconductor apparatus 104, the conductor plate 15 provided at a predetermined distance from the semiconductor elements 13a and 13b is bonded to the metallic plate 24 by laser welding. Here, the metallic plate 24 and the conductor plate 15 are bonded to each other by laser welding in such a manner that the bonding interface 30 between the metallic plate 24 and the conductor plate 15 is positioned at a higher level than the upper end face 24b of the metallic plate 24 located directly above the semiconductor elements 13a and 13b.

In particular, the metallic plate 24 is provided with the projecting portion 24a at a part corresponding to the midsection between the adjacent semiconductor elements 13a and 13b, and the projecting portion 24a and the conductor plate 15 are bonded to each other by laser welding.

In the semiconductor apparatus 104 constructed as described above, a predetermined distance is placed between the molten portion 17 and the upper surfaces of the semiconductor elements 13a and 13b. Thus, during laser welding, heat generated locally in the conductor plate 15 and the metallic plate 24 can be spread to a sufficient degree by the conductor plate 15 and the metallic plate 24 before reaching the semiconductor elements 13a and 13b.

It should be noted that the molten portion 17 may be provided directly above the semiconductor elements 13a and 13b insofar as the side wall portion 24c has such a height not to be affected by heat generation during laser welding.

As a result, the semiconductor apparatus with reduced heat damage to the semiconductor elements 13a and 13b caused by laser irradiation even if the conductor plate 15 and the metallic plate 24 are bonded to each other by laser welding can be obtained.

Although in the above described embodiments, it is assumed that a semiconductor apparatus equipped with two semiconductor elements is used, this is not limitative, but a semiconductor apparatus equipped with four semiconductor elements may be used. If a semiconductor device equipped with four semiconductor elements is used, heat damage to the semiconductor elements caused by laser irradiation can be reduced as in the following embodiment.

A sixth embodiment of the present invention will be explained.

Figure 7A:
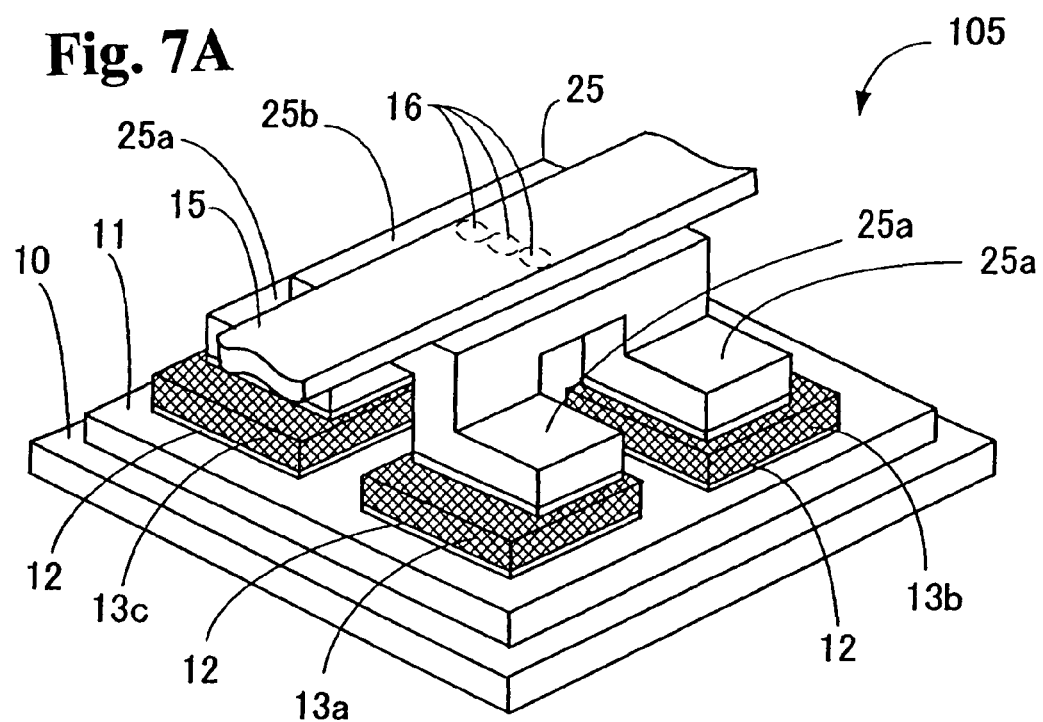
Figure 7B:
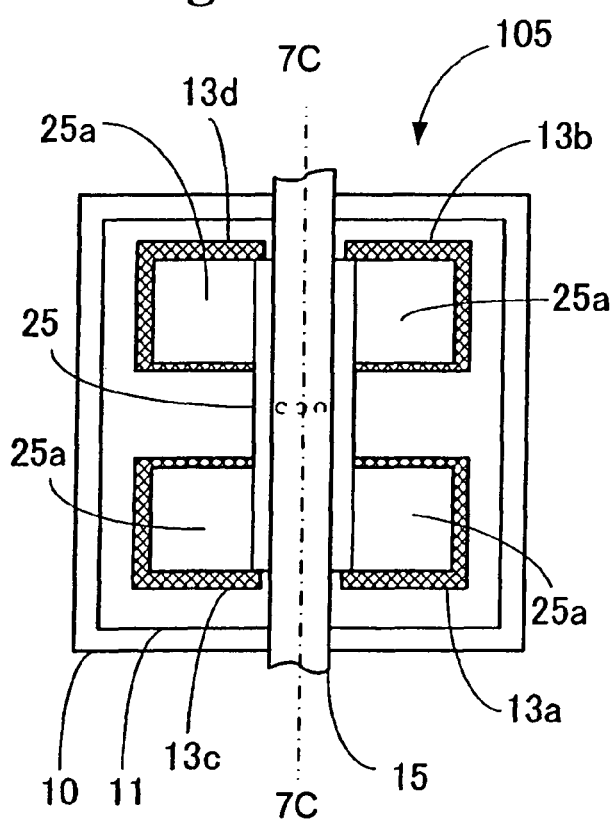
Figure 7C:
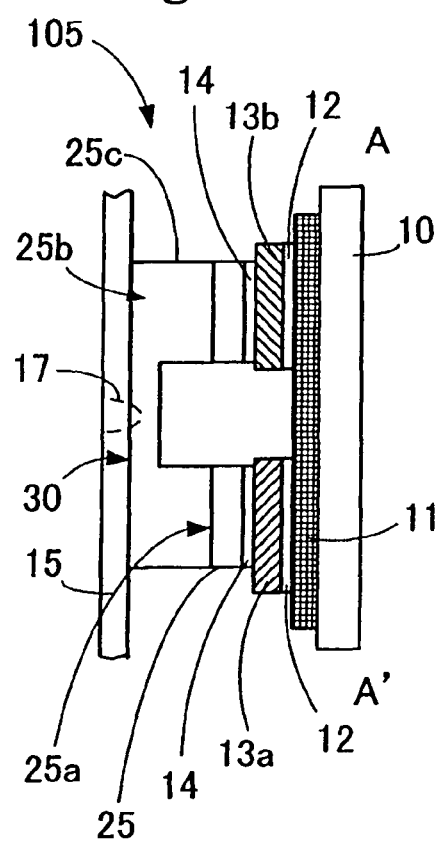
FIG. 7C is a schematic cross-sectional view taken along line 7C-7C in FIG. 7B showing the essential parts of the semiconductor apparatus.
Figure 8:
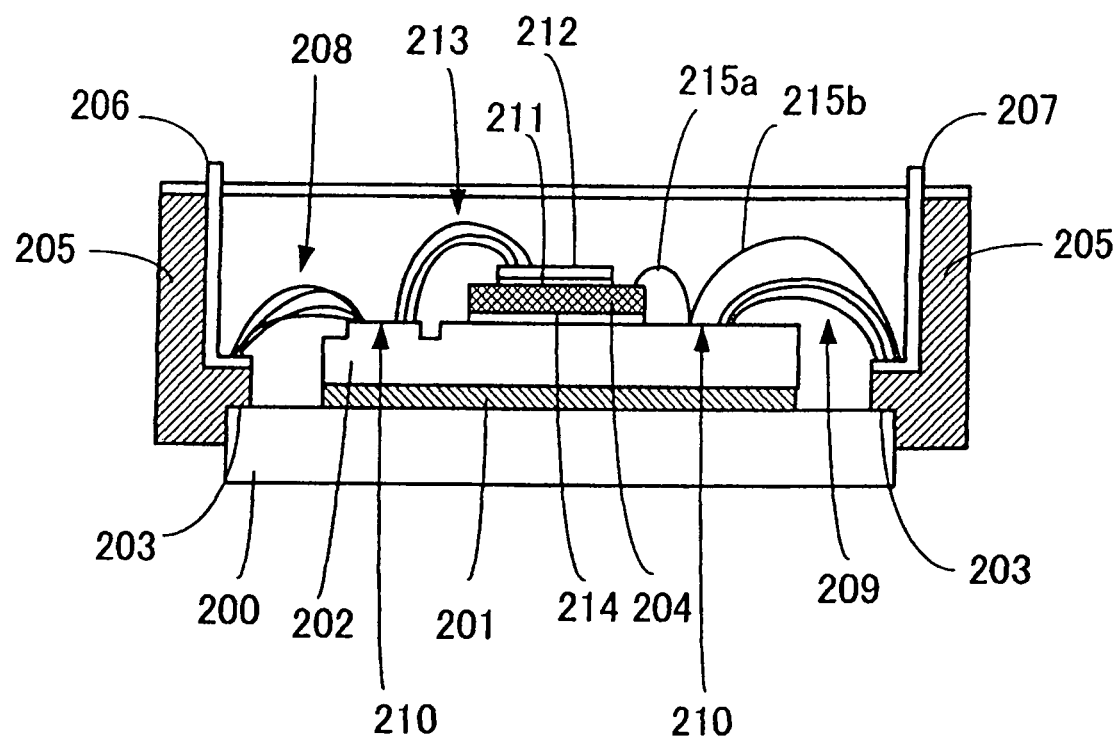
FIG. 8 is a sectional view schematically showing the essential parts of a conventional semiconductor apparatus.

FIGS. 7B and 7C are sectional views schematically showing the essential parts of a semiconductor apparatus according to the sixth embodiment. In the following description of the sixth embodiment, the elements as those appearing in FIG. 1 are denoted by the same reference numerals, and detailed description thereof is omitted. It should be noted that in FIGS. 7A-7C, a cooling element, external lead-out terminals, and a resin case in the semiconductor apparatus are not illustrated.

In this semiconductor apparatus 105, a metallic plate 25 is laid across and soldered onto semiconductor elements 13a, 13b, 13c, and 13d via a solder 14 and bonded to the semiconductor plates 13a, 13b, 13c, and 13d by soldering.

Here, the metallic plate 25 is a three-dimensional block and has a projecting portions 25b at a higher level than upper end faces 25a provided in four directions of the metallic plate 25. Specifically, the metallic plate 25 has steps. A flat surface for laser welding to a conductor plate 15 is formed in an upper surface of the projecting portion 25b. In the illustrated example, the projecting portion 25b is formed like a rectangle with side wall portions 24c raised in a substantially vertical direction from the upper end faces 25a. The side wall portions 25c, however, should not necessarily be rectangles as is the case with the fifth embodiment. For example, the side wall portions 25c may be inclined, bent in the middle, or curved as illustrated in FIGS. 6A to 6D.

The conductor plate 15 is welded onto the projecting portion 25b of the metallic plate 25 by laser welding.

Laser welding is carried out by, for example, irradiating laser light, not shown, from above the conductor plate 15. That is, the conductor plate 15 and the projecting portion 25b are bonded to each other by partially melting each of the conductor plate 15 and the projecting portion 25b onto which the laser light is irradiated.

Specifically, a molten portion 17 where parts of the conductor plate 15 and the projecting portion 25b are molten is provided at a predetermined distance from the upper surfaces of the semiconductor elements 13a, 13b, 13c, and 13d.

Here, the projecting portion 25b of the metallic plate 25 and the conductor plate 15 are bonded to each other by laser welding in such a manner that a bonding interface 30 between the metallic plate 25 and the conductor plate 15 is positioned at a higher level than the upper end faces 25a of the metallic plate 25 located directly above the semiconductor elements 13a, 13b, 13c, and 13d.

In the semiconductor apparatus 105 constructed as described above, a predetermined distance is placed between the molten portion 17 and the upper surfaces of the semiconductor elements 13a, 13b, 13c, and 13d. Thus, during laser welding, heat generated locally in the conductor plate 15 and the metallic plate 25 can be spread to a sufficient degree by the conductor plate 15 and the metallic plate 25 before reaching the semiconductor elements 13a, 13b, 13c, and 13d.

It should be noted that the molten portion 17 may be provided directly above the semiconductor elements 13a, 13b, 13c, and 13d insofar as the side wall portions 25c have such a height not to be affected by heat generation during laser welding.

As a result, the semiconductor apparatus with reduced heat damage to the semiconductor elements 13a, 13b, 13c, and 13d caused by laser irradiation even if the conductor plate 15 and the metallic plate 24 are bonded to each other by laser welding can be obtained.

It should be noted that the semiconductor elements 13a, 13b, 13c, and 13d may be of either the same type or different types. For example, at least one of the semiconductor elements 13a and 13b may be an IGBT element, and the other ones may be FWD elements.

Further, although, in the above described first to sixth embodiments, it is assumed that the number of a plurality of semiconductor elements is two or four, the number of a plurality of semiconductor elements is not necessarily two or four. The present invention can be easily implemented even if a semiconductor apparatus is equipped with semiconductor elements in number other than two or four.

As described above, each of the semiconductor apparatuses according to the above described first to sixth embodiments is equipped with at least one semiconductor element and is comprised of the metallic plate bonded to the upper surface of the semiconductor element, and the conductor plate serving as an electric current path of the semiconductor apparatus. The conductor plate is welded to the part of the metallic plate other than parts thereof located directly above the semiconductor element. As a result, the semiconductor apparatus which can reduce heat damage to the semiconductor element caused by laser irradiation can be obtained.

The disclosure as disclosed in Japanese Patent Application No. 2006-281695 filed on Oct. 16, 2006 is incorporated herein.

While the invention has been explained with reference to the specific embodiments of the invention, the explanation is illustrative, and the invention is limited only by appended claims.

What is claimed is:

1. A semiconductor apparatus comprising:
   at least two semiconductor elements;
   a metallic plate bonded to upper surfaces of the at least two semiconductor elements; and
   a conductor plate bonded to said metallic plate and serving as an electric current path of the semiconductor apparatus,
   wherein said conductor plate and said metallic plate are bonded to each other at a part other than a part directly above the at least two semiconductor elements.

2. A semiconductor apparatus according to claim 1, wherein said metallic plate has a side edge portion located at a side of the semiconductor elements, said conductor plate and said metallic plate being bonded to each other by laser welding at the side edge portion.

3. A semiconductor apparatus according to claim 1, wherein said metallic plate and said conductor plate have a bonding surface therebetween, said bonding surface being located at a level higher than an upper surface of said metallic plate located directly above the at least two semiconductor elements.

4. The semiconductor apparatus according to claim 1, wherein the conductor plate and the metallic plate are bonded to each other by laser welding.

5. The semiconductor apparatus according to claim 1, further comprising a solder layer arranged between the semiconductor element and the metal plate.

6. The semiconductor apparatus according to claim 5, wherein the conductor plate covers a first portion of an upper surface of the metallic plate such that a second portion of the upper surface of the metallic plate is exposed so as to dissipate heat generated by the at least two semiconductor elements.

7. A semiconductor apparatus comprising:
   adjacent semiconductor elements;
   one metallic plate bonded to upper surfaces of the adjacent semiconductor elements; and a conductor plate bonded to said metallic plate and serving as an electric current path of the semiconductor apparatus,
wherein said conductor plate and said metallic plate are bonded to each other at a part directly above a midsection between the adjacent semiconductor elements.

8. A semiconductor apparatus according to claim 7, wherein said metallic plate has a block shape and includes a groove at a bottom surface of said metallic plate corresponding to the midsection between the adjacent semiconductor elements.

9. A semiconductor apparatus according to claim 7, wherein said metallic plate is a rectangular parallelepiped.

10. A semiconductor apparatus according to claim 7, wherein said metallic plate includes a projecting portion at a part corresponding to the midsection between the adjacent semiconductor elements, said projecting portion and said conductor plate being bonded to each other by laser welding.

11. A semiconductor apparatus according to claim 10, wherein said metallic plate has a three-dimensional structure and includes a projecting portion, said projecting portion and said conductor plate being bonded to each other directly by the laser welding.

12. The semiconductor apparatus according to claim 7, wherein the conductor plate and the metallic plate are bonded to each other by laser welding.

13. The semiconductor apparatus according to claim 7, further comprising a solder layer arranged between the semiconductor element and the metal plate.

14. The semiconductor apparatus according to claim 13, wherein the conductor plate covers a first portion of an upper surface of the metallic plate, such that a second portion of the upper surface of the metallic plate is exposed so as to dissipate heat generated by the adjacent semiconductor elements.

* * * * *